United States Patent
Pi et al.

(10) Patent No.: US 9,508,925 B2
(45) Date of Patent: Nov. 29, 2016

(54) MAGNETIC MEMORY DEVICE

(71) Applicants: Ung-hwan Pi, Hwaseong-si (KR);
Kwang-seok Kim, Seoul (KR);
Kee-won Kim, Suwon-si (KR);
Sung-chul Lee, Osan-si (KR);
Young-man Jang, Hwaseong-si (KR)

(72) Inventors: Ung-hwan Pi, Hwaseong-si (KR);
Kwang-seok Kim, Seoul (KR);
Kee-won Kim, Suwon-si (KR);
Sung-chul Lee, Osan-si (KR);
Young-man Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/816,410

(22) Filed: Aug. 3, 2015

(65) Prior Publication Data

US 2016/0079518 A1   Mar. 17, 2016

(30) Foreign Application Priority Data

Sep. 15, 2014 (KR) .................. 10-2014-0122039

(51) Int. Cl.
*H01F 10/32* (2006.01)
*H01L 43/10* (2006.01)
*H01L 43/08* (2006.01)

(52) U.S. Cl.
CPC .............. *H01L 43/10* (2013.01); *H01L 43/08* (2013.01)

(58) Field of Classification Search
CPC ............. H01F 10/3254; H01F 10/324; H01F 10/3268; H01F 10/329
See application file for complete search history.

(56) References Cited

U.S. PATENT DOCUMENTS

| | | | |
|---|---|---|---|
| 7,067,863 B2 | 6/2006 | Guo | |
| 7,307,302 B2 | 12/2007 | Saito | |
| 7,531,367 B2 | 5/2009 | Assefa et al. | |
| 7,897,950 B2 | 3/2011 | Shoji | |
| 7,989,224 B2 | 8/2011 | Gaidis | |
| 8,119,425 B2 | 2/2012 | Cho et al. | |
| 8,541,247 B2 | 9/2013 | Xi et al. | |
| 2004/0127054 A1 | 7/2004 | Lee et al. | |
| 2010/0032777 A1* | 2/2010 | Gao | B82Y 25/00 257/421 |
| 2011/0235217 A1 | 9/2011 | Chen et al. | |
| 2012/0248557 A1 | 10/2012 | Liu et al. | |
| 2015/0340602 A1* | 11/2015 | Guo | H01L 43/12 257/421 |
| 2016/0072043 A1* | 3/2016 | Park | H01L 43/08 257/421 |

OTHER PUBLICATIONS

H.L. Wang. "Scaling of Spin Hall Angle in 3d, 4d, and 5d Metals from $Y_3Fe_5O_{12}$/Metal Spin Pumping". American Physical Society PRL 112 (197201). May 16, 2014. pp. 1-5.
Chi-Feng Pai. "Spin transfer torque devices utilizing the giant spin Hall effect of tungsten". Cornell University. 2012. pp. 1-18.

* cited by examiner

*Primary Examiner* — Jae Lee
(74) *Attorney, Agent, or Firm* — Harness, Dickey & Pierce P.L.C.

(57) ABSTRACT

Provided is a magnetic memory device. The magnetic memory device includes a first magnetization layer, a tunnel barrier disposed on the first magnetization layer, a second magnetization layer disposed on the tunnel barrier, and a spin current assisting layer disposed on at least a portion of a sidewall of the second magnetization layer.

19 Claims, 20 Drawing Sheets

MAGNETIC MEMORY DEVICE

CROSS-REFERENCE TO RELATED APPLICATION

This application claims the benefit of Korean Patent Application No. 10-2014-0122039, filed on Sep. 15, 2014, in the Korean Intellectual Property Office, the disclosure of which is incorporated herein in its entirety by reference.

BACKGROUND

The inventive concept relates to a magnetic memory device, and more particularly, to a magnetic memory device using spin transfer torque (STT).

A vast amount of research has been conducted on electronic devices using magneto-resistive characteristics of a magnetic tunnel junction (MTJ). In particular, as MTJ cells of a magnetic random access memory (MRAM) device have been downscaled, more attention has been paid to STT-MRAMs in which magnetization reversal is induced by directly applying current to MTJ cells so that information can be stored due to a physical phenomenon called a "STT." A highly integrated STT-MRAM requires a rapid switching operation and a low-current operation.

SUMMARY

According to an aspect of the inventive concept, there is provided a magnetic memory device including: a first magnetization layer, a tunnel barrier disposed on the first magnetization layer, a second magnetization layer disposed on the tunnel barrier, and a spin current assisting layer disposed on at least a portion of a sidewall of the second magnetization layer.

The spin current assisting layer may surround the sidewall of the second magnetization layer.

The spin current assisting layer may be in contact with a portion of the tunnel barrier.

The magnetic memory device may further include a passivation layer configured to surround a sidewall of the spin current assisting layer.

The spin current assisting layer may include a material having a giant spin Hall effect.

The spin current assisting layer may have a spin Hall angle of about 0.05 to about 0.5.

The spin current assisting layer may include at least one element selected from the group consisting of tantalum (Ta), tungsten (W), platinum (Pt), tantalum nitride ($TaN_x$), and tungsten nitride ($WN_x$).

The spin current assisting layer may include a first material layer formed on the sidewall of the second magnetization layer, and a second material layer disposed on the first material layer.

The spin current assisting layer may be formed on at least a portion of a top surface of the second magnetization layer.

According to another aspect of the inventive concept, there is provided a magnetic memory device including: a pinned layer including a first magnetization layer, a free layer including a second magnetization layer, a tunnel barrier interposed between the pinned layer and the free layer, and a spin current assisting layer formed on at least a portion of a sidewall of the free layer. The spin current assisting layer is in contact with at least a portion of the tunnel barrier.

The spin current assisting layer may extend along the sidewall of the free layer in a direction from the pinned layer toward the free layer.

The spin current assisting layer may not be electrically connected to the pinned layer.

The free layer may have a first width in a direction parallel to a top surface of the tunnel barrier, and the first width of the free layer may range from about 5 nm to about 50 nm.

The free layer may have a first height in a direction perpendicular to the top surface of the tunnel barrier, and the first height of the free layer may range from about 2 nm to about 50 nm.

When an aspect ratio of the free layer is defined by a ratio of the first height to the first width, the aspect ratio of the free layer may range from about 0.1 to about 25.

According to another aspect of the inventive concept, there is provided a magnetic memory device including: a magnetic tunnel junction (MTJ) structure including a first magnetization layer, a second magnetization layer, and a tunnel barrier interposed between the first and second magnetization layers, and a spin current assisting layer formed on portions of a sidewall of the MTJ structure.

The spin current assisting layer may be formed on a sidewall of the first magnetization layer.

The spin current assisting layer may be electrically connected to the first magnetization layer.

The magnetic memory device may further include a passivation layer formed on the spin current assisting layer.

The spin current assisting layer may include a first material layer and a second material layer that are sequentially stacked on the sidewalls of the first magnetization layer.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF EXAMPLE EMBODIMENTS

Figure 1:
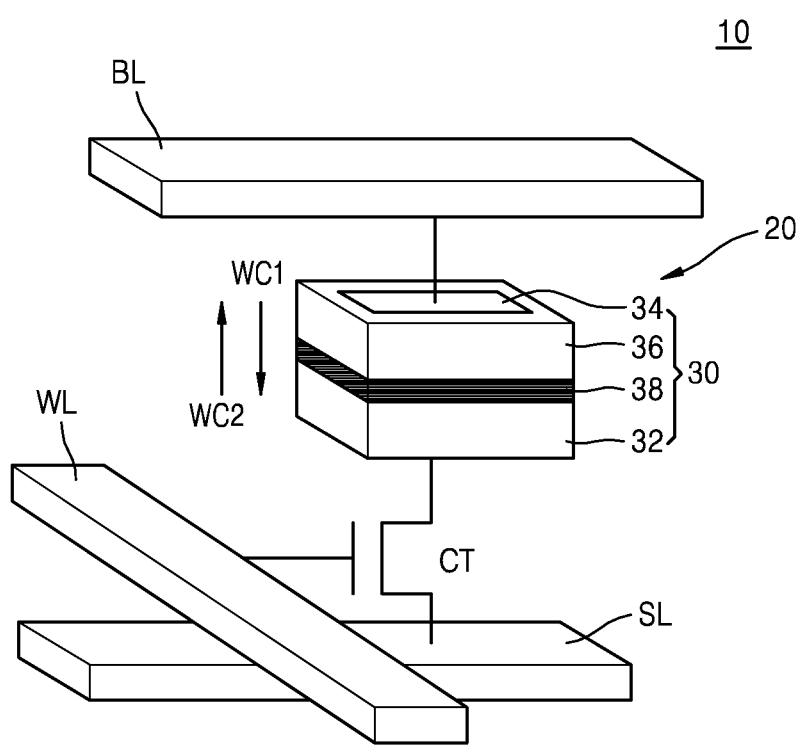
FIG. 1 is a schematic construction diagram of a magnetic memory device according to example embodiments of the inventive concept.

As used herein, expressions such as "at least one of," when preceding a list of elements, modify the entire list of elements and do not modify the individual elements of the list.

The inventive concept will now be described more fully hereinafter with reference to the accompanying drawings, in which example embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. Like numbers refer to like elements throughout. In the drawings, the thicknesses and sizes of layers and regions may be exaggerated for clarity.

FIG. 1 is a schematic diagram of a magnetic memory device 10 according to example embodiments of the inventive concept. FIG. 1 illustrates a memory cell 20 of the magnetic memory device 10, which is embodied in a spin transfer torque-magnetic random access memory (STT-MRAM).

The memory cell 20 may include a magnetic tunnel junction (MTJ) structure 30 and a cell transistor CT. A gate of the cell transistor CT may be connected to a word line WL. One electrode of the cell transistor CT may be connected to a bit line BL through the MTJ structure 30, and the other electrode of the cell transistor CT may be connected to a source line SL.

The MTJ structure 30 may include a pinned layer 32, a free layer 34, a spin current assisting layer 36 formed on sidewalls of the free layer 34, and a tunnel barrier 38 interposed between the pinned layer 32 and the free layer 34.

The pinned layer 32 may have a magnetization easy axis along a direction extending from the pinned layer 32 toward the free layer 34, and have a fixed magnetization direction. The free layer 34 may have a magnetization easy axis along a direction extending from the free layer 34 toward the pinned layer 32, and have a variable magnetization direction depending on conditions.

A resistance of the MTJ structure 30 may vary according to the magnetization direction of the free layer 34. When the magnetization direction of the free layer 34 is parallel to the magnetization direction of the pinned layer 32, the MTJ structure 30 may have a low resistance and store data '0'. When the magnetization direction of the free layer 34 is anti-parallel to the magnetization direction of the pinned layer 32, the MTJ structure 30 may have a high resistance and store data '1'.

The arrangement of the pinned layer 32 and the free layer 34 is not limited to an example shown in FIG. 1, and positions of the pinned layer 32 and the free layer 34 may be exchanged.

In the magnetic memory device 10 shown in FIG. 1, to enable a write operation of the STT-MRAM, a logic-high voltage may be applied to the word line WL to turn on the cell transistor CT, and write currents WC1 and WC2 may be applied between the bit line BL and the source line SL. In this case, the magnetization direction of the free layer 34 may depend on directions of the write currents WC1 and WC2. In the MTJ structure 30, the magnetization direction of the free layer 34 may be changed due to an STT.

In the magnetic memory device 10 shown in FIG. 1, to enable a read operation of the STT-MRAM, a logic-high voltage may be applied to the word line WL to turn on the cell transistor CT, and a read current may be applied from the bit line BL toward the source line SL to determine data stored in the MTJ structure 30. In this case, since the read current has a much lower magnitude than the write currents WC1 and WC2, the magnetization direction of the free layer 34 may not be changed due to the read current.

Figure 2:
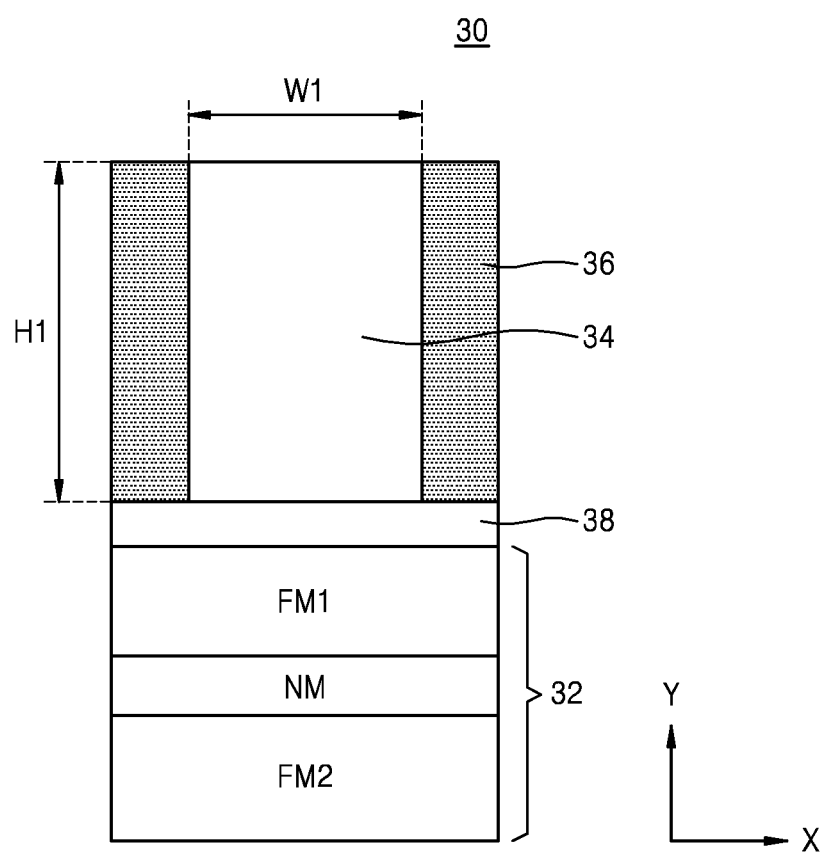
FIG. 2 is an enlarged cross-sectional view of a magnetic tunnel junction (MTJ) structure shown in FIG. 1.

FIG. 2 is an enlarged cross-sectional view of the MTJ structure 30 shown in FIG. 1.

Referring to FIG. 2, the pinned layer 32 may have a synthetic antiferromagnets (SAF) structure. The pinned layer 32 may include two ferromagnetic layers FM1 and FM1 separated from each other by a non-magnetic thin layer NM. Due to a Ruderman-Kittel-Kasuya-Yosida (RKKY) interaction caused by the non-magnetic thin layer NM inserted between the two ferromagnetic layers FM1 and FM2, the SAF structure may exhibit antiferromagnetic coupling (AFC) characteristics. Magnetic domains of the respective ferromagnetic layers FM1 and FM2 may be aligned in opposite directions by AFC between the two ferromagnetic layers FM1 and FM2 such that the magnetization of the entire SAF structure may be reduced or minimized. When a magnetic field externally applied to the free layer 34 gradually increases and reaches a reversed magnetic field, which is a critical value (or a threshold) of magnetization reversal, an electric resistance may be instantaneously changed due to magnetization reversal.

In example embodiments, the ferromagnetic layers FM1 and FM2 may include iron (Fe), cobalt (Co), nickel (Ni), or an alloy thereof and multilayered structures thereof. For example, the ferromagnetic layers FM1 and FM2 may include CoFeB, CoFe, NiFe, FePt, or CoPt. Alternatively, the ferromagnetic layers FM1 and FM2 may include (Co/Ni)n, (Co/Pt)n or (Co/Pd)n (here, n is a natural number). The non-magnetic thin layer NM may include a single metal selected from the group consisting of ruthenium (Ru), chromium (Cr), platinum (Pt), palladium (Pd), iridium (Ir), rhodium (Rh), osmium (Os), rhenium (Re), gold (Au), and copper (Cu) or an alloy thereof. For example, the SAF structure may have a multilayered structure formed of CoFeB/Ta/(Co/Pt)m/Ru/(Co/Pd)n (here, each of m and n is a natural number).

The tunnel barrier 38 may be formed to a predetermined thickness on the pinned layer 32. For example, the tunnel barrier 38 may have a smaller thickness than the spin diffusion length. The tunnel barrier 38 may include a non-magnetic material. In example embodiments, the tunnel barrier 38 may include at least one selected from the group consisting of oxides of magnesium (Mg), titanium (Ti), aluminum (Al), magnesium-zinc (MgZn), and magnesium-boron (MgB) and nitrides of titanium (Ti) and vanadium (V). For instance, the tunnel barrier 38 may be a magnesium oxide (MgO) layer. In another case, the tunnel barrier 38 may include a plurality of layers. For example, the tunnel barrier 38 may include magnesium (Mg)/magnesium oxide (MgO), magnesium oxide (MgO)/magnesium (Mg), or magnesium (Mg)/magnesium oxide (MgO)/magnesium (Mg). In example embodiments, the tunnel barrier 38 may have a predetermined crystal structure. For example, the tunnel barrier 38 may have a NaCl crystal structure (face centered cubic (FCC) lattice structure).

The free layer 34 may be formed on the tunnel barrier 38. The free layer 34 may have a magnetization easy axis along a direction extending from the free layer 34 toward the pinned layer 32 (e.g., Y direction of FIG. 2). In this case, the vertical magnetic memory device 10 may be embodied.

In example embodiments, the free layer 34 may include a perpendicular magnetic anisotropy (PMA) material. In example embodiments, the free layer 34 may include at least one selected from the group consisting of Fe, Co, Ni, Pd, and Pt. The free layer 34 may be formed of a Co-M1 alloy (here, M1 is at least one metal selected from the group consisting of Pt, Pd, and Ni) or a Fe-M2 alloy (here, M2 is at least one metal selected from the group consisting of Pt, Pd, and Ni). The Co-M1 alloy or Fe-M2 alloy may have a $L1_0$ structure. In other embodiments, the free layer 34 may further include at least one material selected from the group consisting of boron (B), carbon (C), copper (Cu), silver (Ag), gold (Au), ruthenium (Ru), tantalum (Ta), and chromium (Cr). In example embodiments, the free layer 34 may be formed to include a multilayered structure of (Co/Pt)m, (Co/Pd)m, or (Co/Ni)m (here, m is a natural number).

The free layer 34 may have a first height H1 along a direction extending from the free layer 34 toward the pinned layer 32 (i.e., Y direction of FIG. 2), and have a first width W1 in a direction (i.e., X direction of FIG. 2) perpendicular to the direction from the free layer 34 toward the pinned layer 32. In example embodiments, the first height H1 of the free layer 34 may range from about 2 nm to 50 nm, but is not limited thereto. In example embodiments, the first width W1 of the free layer 34 may range from about 5 nm to 50 nm, but is not limited thereto. Also, when a ratio of the first height H1 of the free layer 34 to the first width W1 of the free layer 34 is defined as an aspect ratio, the free layer 34 may have an aspect ratio of about 0.1 to about 25, but the aspect ratio of the free layer 34 is not limited thereto.

The spin current assisting layer 36 may be formed on sidewalls of the free layer 34, and a bottom surface of the spin current assisting layer 36 may be in contact with a portion of a top surface of the tunnel barrier 38. The spin current assisting layer 36 may be formed to surround substantially the entire sidewalls of the free layer 34. In another case, the spin current assisting layer 36 may be formed on at least portions of sidewalls of the spin current assisting layer 36. In example embodiments, the spin current assisting layer 36 may include a material having a giant spin Hall effect. The spin current assisting layer 36 may transmit a spin current to the free layer 34 using a giant spin Hall effect. Thus, a switching current required to transfer a spin torque from the pinned layer 32 to the free layer 34 may be reduced in the MTJ structure 30.

For example, materials having a giant spin Hall effect may be non-magnetic materials having high spin-orbit coupling characteristics. In a junction structure between a non-magnetic material having high spin-orbit coupling characteristics and a magnetic material, a spin torque may be transferred from the non-magnetic material having high spin-orbit coupling characteristics to the magnetic material. This phenomenon may be referred to as a giant spin Hall effect. Meanwhile, the transmission of a spin current due to the giant spin Hall effect will be described in detail later with reference to FIGS. 3A through 3C.

In example embodiments, the spin current assisting layer 36 may include at least one material selected from the group consisting of tantalum (Ta), tungsten (W), platinum (Pt), gold (Au), tantalum nitride ($TaN_x$), and tungsten nitride ($WN_x$). For example, the spin current assisting layer 36 may include an alloy of tantalum (Ta), tungsten (W), platinum (Pt), or gold (Au) and other metal elements. However, a material of the spin current assisting layer 36 is not limited thereto, and the spin current assisting layer 36 may include other metal elements having a giant spin Hall effect or alloys thereof.

In example embodiments, the spin current assisting layer 36 may include a material having a spin Hall angle $\theta_H$ of about 0.05 to 0.5. Here, the spin Hall angle $\theta_H$ may be used as a measure of spin-orbit coupling characteristics. The spin Hall angle $\theta_H$ may be expressed by a ratio of a current due to a spin transfer $J_S$ to a current due to a charge transfer $J_C$.

$$\theta_H = J_S/J_C$$

Table 1 exemplarily shows spin Hall angles $\theta_H$ of various metal elements. Methods of measuring spin Hall angles $\theta_H$ as shown in Table 1 use a spin Hall ferromagnet resonance and an inverse spin Hall effect, which may be understood in detail with reference to documents R1: "Spin transfer torque devices utilizing the giant spin Hall effect of tungsten (Appl. Phys. Lett. 101, 122404 (2012))" by Chi-Feng Pai et al., R2: "Spin-Torque Switching with the Giant Spin Hall Effect of Tantalum (Science, Vol. 336, no. 6081, pp. 555-558 (2012))" by Luqiao Liu et al., and R3: "Scaling of Spin Hall Angle in 3d, 4d, and 5d Metals from $Y_3Fe_5O_{12}$/Metal Spin Pumping (Phys. Rev. Lett. 112, 197201 (2014))" by H. L. Wang et al.

TABLE 1

| Material | Spin Hall angle ($\theta_H$) | Measuring method |
| --- | --- | --- |
| β-tungsten (β-W) | 0.33 | Spin Hall ferromagnet resonance (R1) |
| β-tantalum (β-Ta) | 0.15 | Spin Hall ferromagnet resonance (R2) |
| Platinum (Pt) | 0.07 | Spin Hall ferromagnet resonance (R1) |
| Gold (Au) | 0.084 | Inverse spin Hall effect (R3) |
| Sliver (Ag) | 0.0068 | Inverse spin Hall effect (R3) |
| Copper (Cu) | 0.0032 | Inverse spin Hall effect (R3) |

In example embodiments, the spin current assisting layer 36 may have a thickness of about 1 nm to about 10 nm in a direction (e.g., X direction of FIG. 2) that is substantially perpendicular to a direction from the pinned layer 32 toward the free layer 34, but the thickness of the spin current assisting layer 36 is not limited thereto. For example, the thickness of the spin current assisting layer 36 may be smaller than several times a spin diffusion length. For example, the thickness of the spin current assisting layer 36 may be smaller than five times the spin diffusion length. The spin diffusion length may vary according to the kind of metal elements. For example, tungsten may have a spin diffusion length of about 1 nm. In example embodiments, when the spin current assisting layer 36 includes tungsten, the spin current assisting layer 36 may have a thickness of about 1 nm to about 5 nm. When the spin current assisting layer 36 has an excessively small thickness, it may be difficult to uniformly (or conformally) form the spin current assisting layer 36 on sidewalls of the free layer 34, and a minimum effective magnetic field required to transfer a spin current may not be formed. Since a giant spin Hall effect occurs in a very small thickness of the spin current assisting layer 36 near an interface between the spin current assisting layer 36 and the free layer 34, when the spin current assisting layer 36 has an excessively large thickness, spin torque transfer efficiency may be reduced.

As described above, the free layer 34 may have a first width W1 of about 5 nm to about 50 nm and a first height H1 of about 2 nm to about 50 nm. When the first width W1 of the free layer 34 is relatively large, effects of an effective magnetic field due to the spin current assisting layer 36 may not be significant. However, as the first width W1 of the free layer 34 becomes smaller, the effects of the effective magnetic field due to the spin current assisting layer 36 may become larger. Also, when the free layer 34 includes a bulk perpendicular magnetic anisotropy (IPMA) material instead of an interfacial perpendicular magnetic anisotropy (IPMA) material to improve thermal stability of the MTJ structure 30, the free layer 34 may be formed to have a relatively large first height H1. The spin current assisting layer 36 may be conformally formed on sidewalls of the free layer 34 and have substantially the same height as the first height H1 of the spin current assisting layer 36. In this case, transfer efficiency of a spin torque due to the spin current assisting layer 36 may further increase.

Accordingly, the magnetic memory device 10 including the MTJ structure 30 having the spin current assisting layer 36 may operate at a low operating current. Also, since the MTJ structure 30 has a high aspect ratio, integration density of the magnetic memory device 10 may be increased.

Hereinafter, a method of driving a magnetic memory device 10 according to example embodiments of the inventive concept will schematically be described with reference to FIGS. 3A through 3C.

Figure 3A:
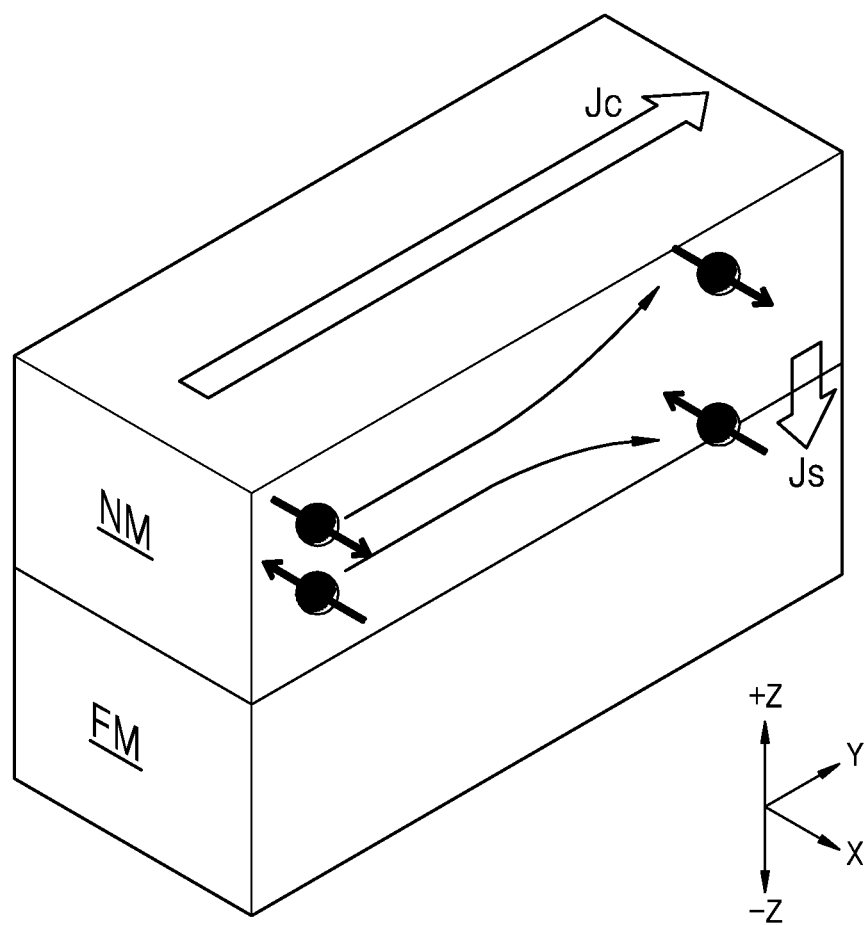
FIGS. 3A through 3C are schematic diagrams illustrating a method of driving a magnetic memory device according to example embodiments of the inventive concept.

FIG. 3A schematically illustrates a spin current generated due to current in a junction structure between a non-magnetic material and a magnetic material. After a stack structure of a non-magnetic metal layer NM and a magnetic metal layer FM is formed, current may be supplied in a longitudinal direction of the non-magnetic metal layer NM of the stack structure (e.g., a lengthwise direction of the stack structure or a Y direction of FIG. 3A). In this case, current due to a charge transfer may be denoted by $J_C$. Since the non-magnetic metal layer NM has high spin-orbit coupling characteristics, electrons having one spin (e.g., spin-up) may be deflected in a traverse direction of the non-magnetic metal layer NM (e.g., a perpendicular direction to the lengthwise direction of the stack structure or a +Z direction of FIG. 3A), and electrons having the opposite spin (e.g., spin-down) may be deflected in another direction (e.g., a −Z direction of FIG. 3A). For example, when current flows in the Y direction, up spins may be accumulated in the +Z direction, and down spins may be accumulated in the −Z direction. By summing up the up spins and the down spins, a spin current may be generated in the −Z direction (or the +Z direction). The spin current may be denoted by $J_S$ in FIG. 3A. That is, when current is supplied to the non-magnetic metal layer NM, the spin current $J_S$ may be induced in a perpendicular direction to the direction of the current $J_C$, and a spin torque may be transferred to the magnetic metal layer FM that is in contact with the non-magnetic metal layer NM.

Figure 3B:
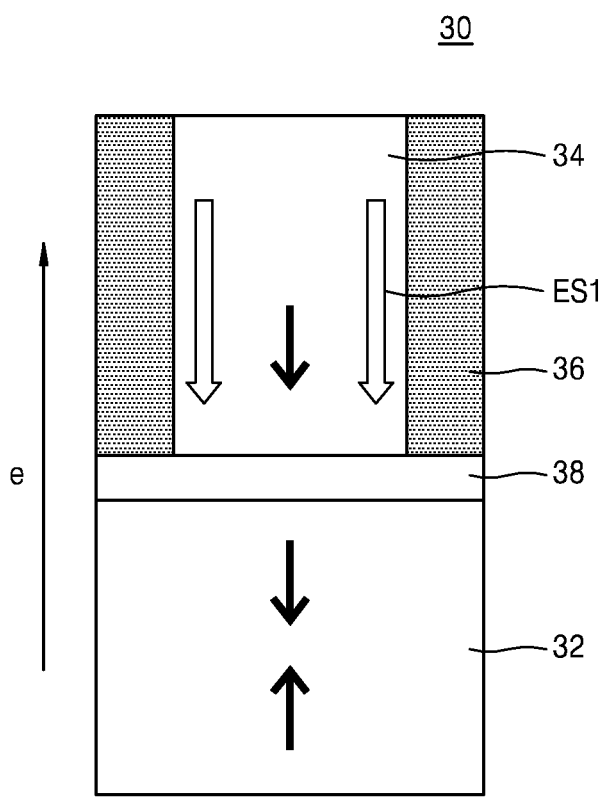
Figure 3C:
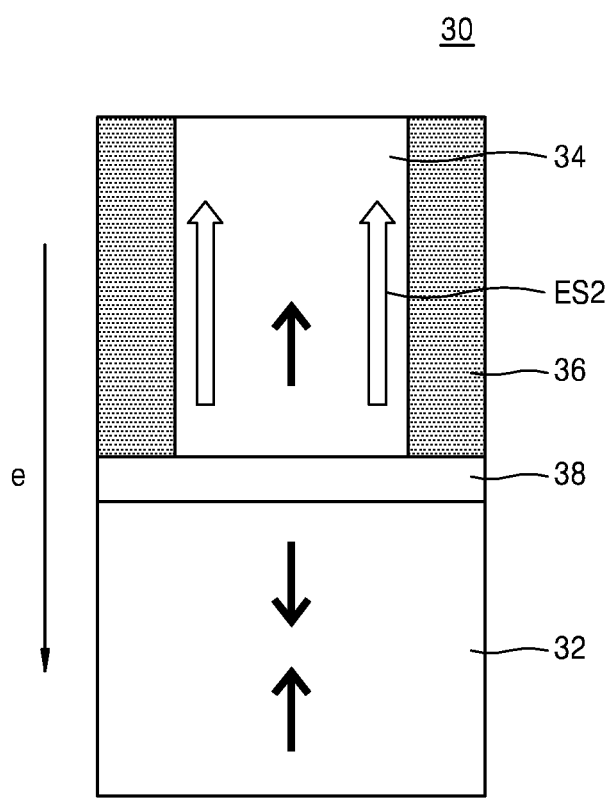

FIGS. 3B and 3C schematically illustrate effective magnetic fields ES1 and ES2 generated by a spin current assisting layer 36 during an operation of an MTJ structure 30 of a magnetic memory device 10 according to example embodiments of the inventive concept.

Referring to FIGS. 3B and 3C, additional effective magnetic fields ES1 and ES2 may be generated due to a spin current assisting layer 36 according to a direction in which a bias is applied between a pinned layer 32 and a free layer 34. The spin current assisting layer 36 and the free layer 34 shown in FIGS. 3B and 3C may respectively correspond to the non-magnetic metal layer NM and the magnetic metal layer FM shown in FIG. 3A. For example, as shown in FIG. 3B, when electrons face upward, a direction of a spin torque transferred to the free layer 34 may be parallel to a direction of applied current (i.e., may be switched in a parallel state to the direction of the applied current), and a spin current may be induced from the spin current assisting layer 36 to the free layer 34 due to a bias applied to the spin current assisting layer 36. In this case, a magnetization direction of the pinned layer 32 may be determined such that a direction of the effective magnetic field ES1 is substantially the same direction as a direction of a spin torque transferred from the pinned layer 32 to the free layer 34. Since an effective magnetic field ES1 generated by the spin current assisting layer 36 is generated in a direction from the free layer 34 toward the pinned layer 32, the magnetic memory device 10 including the spin current assisting layer 36 may be switched at a smaller write current in comparison to a write current at which a magnetic memory device that does not include the spin current assisting layer 36 is switched (i.e., using only the spin torque transferred from the pined layer 32 to the free layer 34).

For example, as shown in FIG. 3C, when electrons face downward, a direction of a spin torque transferred to the free layer 34 may be anti-parallel to a direction of applied current (i.e., may be switched in an anti-parallel state to the direction of the applied current), and a spin current may be induced from the spin current assisting layer 36 to the free layer 34 due to a bias applied to the spin current assisting layer 36. Since an effective magnetic field ES2 generated by the spin current assisting layer 36 is generated in a direction from the pinned layer 32 toward the free layer 34, the magnetic memory device 10 may be switched at a smaller write current in comparison to a write current at which a magnetic memory device that does not include the spin current assisting layer 36 is switched (i.e., using only a spin torque transferred from the pinned layer 32 to the free layer 34).

Figure 4:
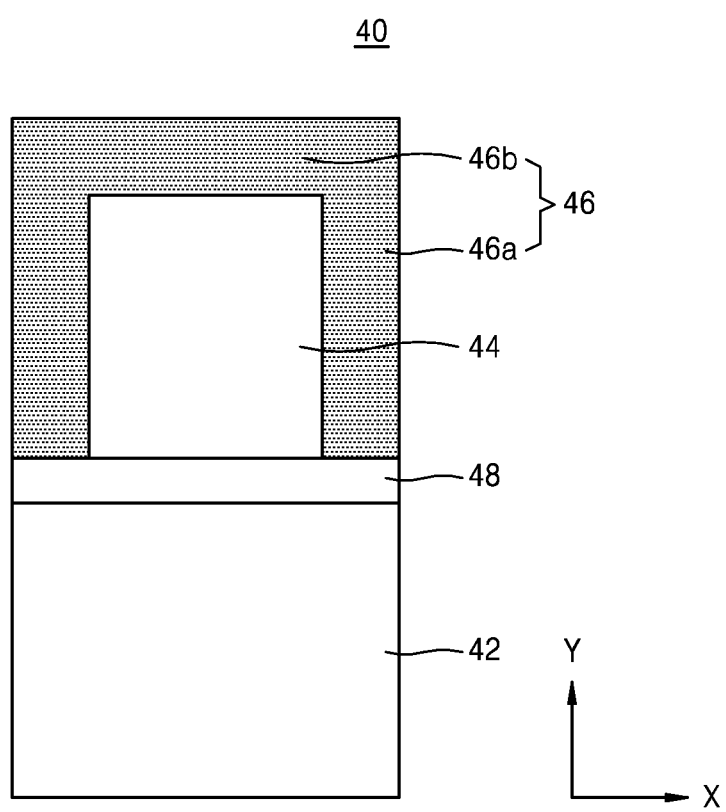
FIG. 4 is a cross-sectional view of an MTJ structure according to example embodiments of the inventive concept.

FIG. 4 is a cross-sectional view of an MTJ structure 40 according to example embodiments of the inventive concept. Since the MTJ structure 40 is similar to the MTJ structure 30 described with reference to FIG. 2 except for a structure of a spin current assisting layer 46, differences between the MTJ structure 40 and the MTJ structure 30 will chiefly be described.

Referring to FIG. 4, a tunnel barrier 48 may be interposed between the pinned layer 42 and the free layer 44, and a spin current assisting layer 46 may be formed on sidewalls and a top surface of the free layer 44. The spin current assisting layer 46 may include a first portion 46a and a second portion 46b. The first portion 46a of the spin current assisting layer 46 may be conformally formed on the sidewalls of the free layer 44, and the second portion 46b of the spin current assisting layer 46 may be formed on the top surface of the free layer 44. The first portion 46a and the second portion 46b may have the same thickness or different thicknesses. FIG. 4 illustrates a case in which the first portion 46a and the second portion 46b of the spin current assisting layer 46 are respectively formed on substantially the entire sidewalls and top surface of the free layer 44, but the inventive concept is not limited thereto. In another case, the first portion 46a and the second portion 46b of the spin current assisting layer 46 may be respectively formed on portions of the sidewalls of the free layer 44 and a portion of the top surface of the free layer 44.

Figure 5:
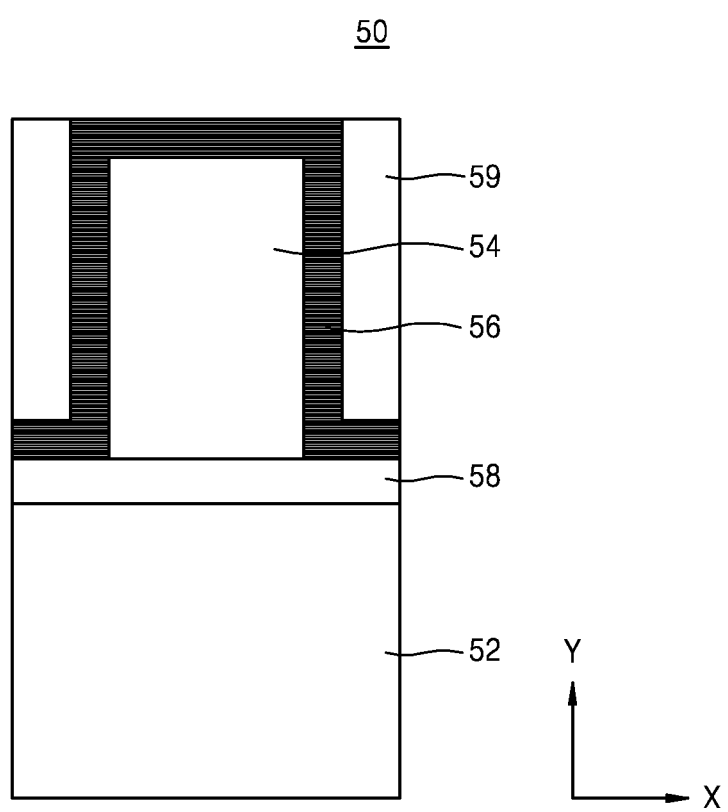
FIG. 5 is a cross-sectional view of an MTJ structure according to example embodiments of the inventive concept.

FIG. 5 is a cross-sectional view of an MTJ structure 50 according to example embodiments of the inventive concept. Since the MTJ structure 50 is similar to the MTJ structure 30 described with reference to FIG. 2 except that the MTJ structure 50 further includes a passivation layer 59, differences between the MTJ structure 50 and the MTJ structure 30 will chiefly be described.

Referring to FIG. 5, a tunnel barrier 58 may be interposed between a pinned layer 52 and a free layer 54, and a spin current assisting layer 56 may be conformally formed on sidewalls and a top surface of the free layer 54. A passivation layer 59 may be formed on sidewalls of the spin current assisting layer 56. The passivation layer 59 may be formed of an insulating material, such as silicon oxide, aluminum oxide, zinc oxide, titanium oxide, silicon oxynitride, or silicon nitride, but a material of the passivation layer 59 is not limited thereto. The passivation layer 59 may be formed to a predetermined thickness on substantially the entire sidewalls of the spin current assisting layer 56, and function as a capping layer for preventing oxidation of the free layer 54.

In example embodiments, the spin current assisting layer 56 may conformally extend in a perpendicular direction from the sidewalls of the free layer 54 so that portions of the spin current assisting layer 56 can be in contact with portions of a top surface of the tunnel barrier 58. A passivation layer 59 may be formed on the portions of the spin current assisting layer 56 that may be in contact with the tunnel barrier 58. Sidewalls and bottom surfaces of the passivation layer 59 may be in contact with the spin current assisting layer 56, and the passivation layer 59 may not be in direct contact with the tunnel barrier 58.

Figure 6:
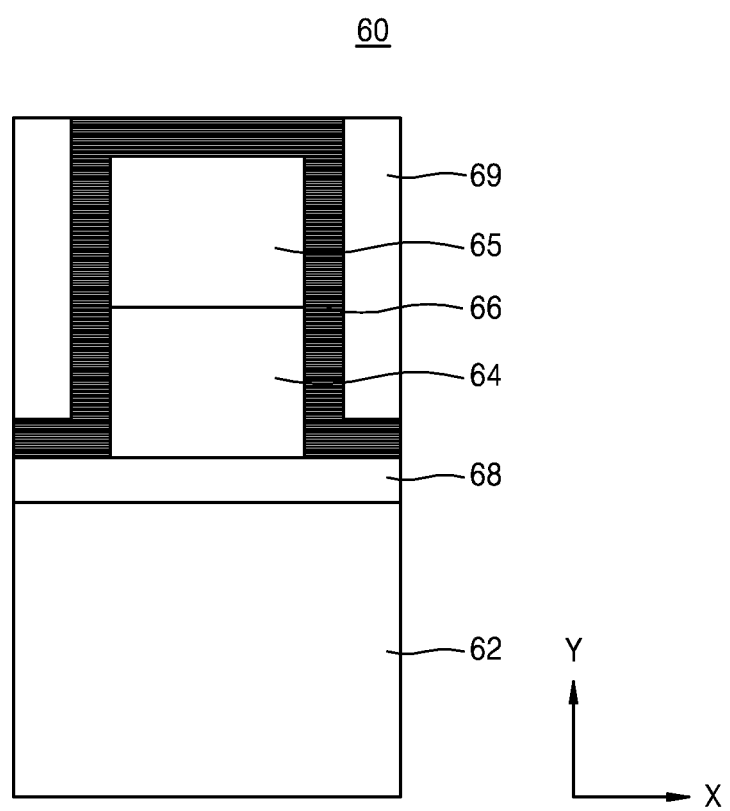
FIG. 6 is a cross-sectional view of an MTJ structure according to example embodiments of the inventive concept.

FIG. 6 is a cross-sectional view of an MTJ structure 60 according to example embodiments of the inventive concept. Since the MTJ structure 60 is similar to the MTJ structure 30 described with reference to FIG. 2 except that the MTJ structure 60 further includes a capping layer 65, differences between the MTJ structure 60 and the MTJ structure 30 will chiefly be described.

Referring to FIG. 6, a tunnel barrier 68 may be interposed between a pinned layer 62 and a free layer 64, and a capping layer 65 may be formed on the free layer 64. A spin current assisting layer 66 may be formed on sidewalls of a stack structure of the free layer 64 and the capping layer 65. Optionally, the spin current assisting layer 66 may be formed also on a top surface of the capping layer 65. In example embodiments, the capping layer 65 may include aluminum (Al), copper (Cu), gold (Au), titanium (Ti), ruthenium (Ru), titanium (Ti) or titanium nitride (TiN). The capping layer 65 may serve as a hard mask during a process of patterning the free layer 64, and prevent the free layer 64 from being oxidized during the process of patterning the free layer 64. Optionally, a passivation layer 69 may be further formed on sidewalls of the spin current assisting layer 66.

Figure 7:
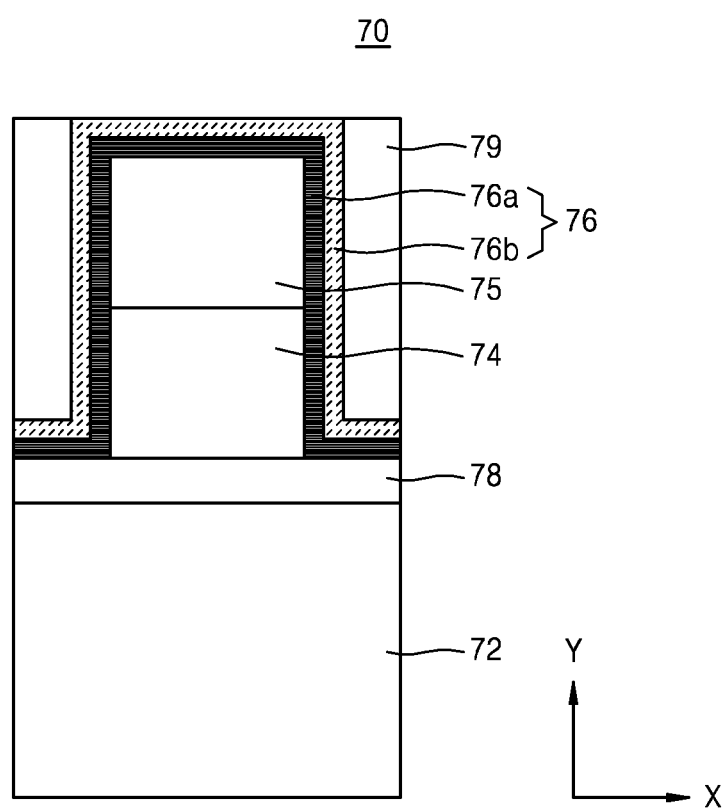
FIG. 7 is a cross-sectional view of an MTJ structure according to example embodiments of the inventive concept.

FIG. 7 is a cross-sectional view of an MTJ structure 70 according to example embodiments of the inventive concept. Since the MTJ structure 70 is similar to the MTJ structure 30 described with reference to FIG. 2 except for a structure of a spin current assisting layer 76, differences between the MTJ structure 70 and the MTJ structure 30 will chiefly be described.

Referring to FIG. 7, a tunnel barrier 78 may be interposed between a pinned layer 72 and a free layer 74, and a capping layer 75 may be formed on the free layer 74. A spin current assisting layer 76 may be formed on sidewalls of a stack structure of the free layer 74 and the capping layer 75. The spin current assisting layer 76 may include a stack structure of a first material layer 76a and a second material layer 76b. The first material layer 76a may be formed on sidewalls of the free layer 74, and the second material layer 76b may be formed on the first material layer 76a. In example embodiments, the first material layer 76a and the second material layer 76b may include materials having a giant spin Hall effect. Each of the first material layer 76a and the second material layer 76b may include a material having a spin Hall angle of about 0.05 to 0.5. In example embodiments, the first material layer 76a may include a material having a first spin Hall angle, the second material layer 76b may include a material having a second spin Hall angle, and the first spin Hall angle may be larger than the second spin Hall angle. However, the spin Hall angles of the first and second material layers 76a and 76b are not limited thereto. In other embodiments, the first material layer 76a formed on the sidewalls of the free layer 74 may include a material having a giant spin Hall effect, and the second material layer 76b may include a non-magnetic metal material that does not exhibit a spin Hall effect. A passivation layer 79 may be further formed on sidewalls of the second material layer 76b.

In example embodiments of the present inventive concepts, a three dimensional (3D) memory array may be provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertically-stacked structure of memory cells such that at least one memory cell is located over another memory cell. The at least one memory cell may comprise a MTJ stack.

FIGS. 8A through 8K are cross-sectional views illustrating a method of fabricating the magnetic memory device 100 (refer to FIG. 8J) according to example embodiments of the inventive concept. As an example, a method of fabricating a magnetic memory device including the MTJ structure 60 shown in FIG. 6 will be described with reference to FIGS. 8A through 8K. In FIGS. 8A through 8J, the same reference numerals are used to denote the same elements as in FIG. 6 and thus, detailed descriptions thereof are omitted here.

Figure 8A:
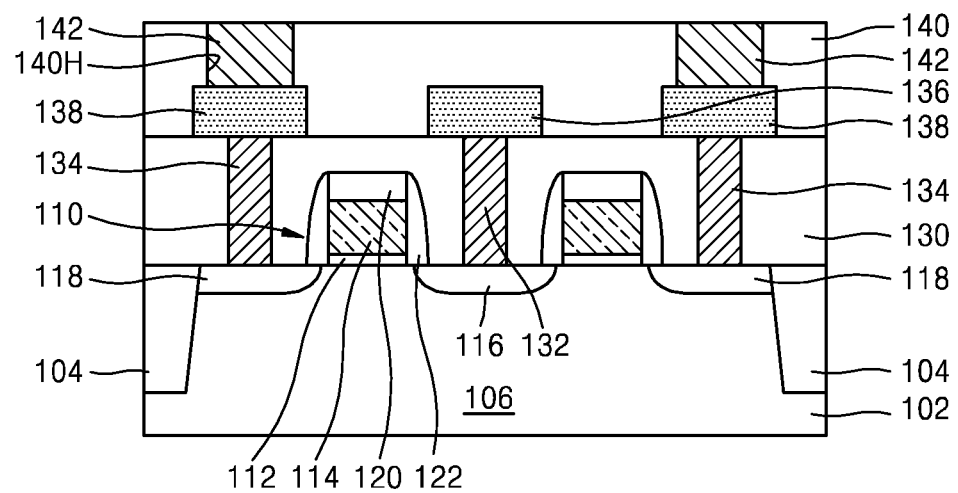
FIGS. 8A through 8J are cross-sectional views illustrating a method of fabricating a magnetic memory device according to example embodiments of the inventive concept.

Referring to FIG. 8A, an isolation layer 104 may be formed on a substrate 102 to define an active region 106, and a transistor 110 may be formed in the active region 106.

In example embodiments, the substrate 102 may be a semiconductor substrate, such as a silicon (Si) substrate, a germanium (Ge) substrate, a silicon carbide (SiC) substrate, a gallium arsenide (GaAs) substrate, an indium arsenide (InAs) substrate, or an indium phosphide (InP) substrate. In example embodiments, the substrate 102 may include a conductive region, for example, a doped well or a doped structure. The isolation layer 104 may have a shallow trench isolation (STI) structure.

The transistor 110 may include a gate insulating layer 112, a gate electrode 114, a source region 116, and a drain region 118. A top surface and both sidewalls of the gate electrode 114 may be electrically insulated by an insulating capping pattern 120 and insulating spacers 122.

A first insulating interlayer 130 may be formed on the substrate 102 to cover the transistor 110. A first contact plug 132 may be electrically connected to the source region 116 through the first insulating interlayer 130. A second contact plug 134 may be electrically connected to the drain region 118. A conductive layer (not shown) may be formed on the first insulating interlayer 130 and patterned to form a source line 136 and conductive patterns 138. The source line 136 may be electrically connected to the source region 116 through a plurality of first contact plugs 132. The conductive patterns 138 may be formed on both sides of the source line 136 and electrically connected to drain regions 118 through second contact plugs 134.

Thereafter, a second insulating interlayer 140 may be formed on the first insulating interlayer 130 to cover the source line 136 and the conductive patterns 138. The second insulating interlayer 140 may be partially removed to expose a top surface of the conductive pattern 138, thereby forming a lower electrode contact hole 140H. The lower electrode contact hole 140H may be filled with a conductive material, and the conductive material may be polished to expose a top surface of the second insulating interlayer 140, thereby forming a lower electrode contact plug 142. In example embodiments, the lower electrode contact plug 142 may include at least one material selected from the group consisting of TiN, Ti, TaN, Ta, or W.

Figure 8B:
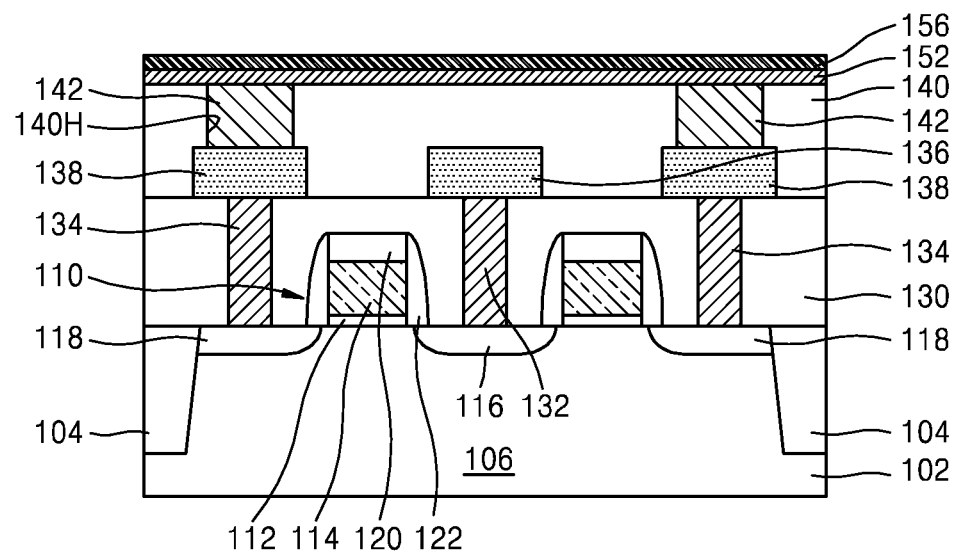

Referring to FIG. 8B, a lower electrode layer 152 may be formed on the second insulating interlayer 140 and the lower electrode contact plug 142. In example embodiments, the lower electrode layer 152 may be formed of a metal or a metal nitride. For example, the lower electrode layer 152 may be formed of TiN using a chemical vapor deposition (CVD) process, a physical vapor deposition (PVD) process, an atomic layer deposition (ALD) process, or a reactive pulsed laser deposition (reactive PLD) process. In example embodiments, the lower electrode layer 152 may include a TiN layer having relatively low N content to embody a low wiring resistance. For example, the lower electrode layer 152 may include a TiN layer in which atomic percent (at %) of nitrogen is lower than atomic percent of titanium.

Subsequently, a seed layer 156 may be formed on the lower electrode layer 152. The seed layer 156 may include a Ru layer, a Pt layer, or a Pd layer. The seed layer 156 may be formed using a CVD process, a PVD process, an ALD process, or a reactive PLD process. In example embodiments, the seed layer 156 may be formed using a direct-current (DC) magnetron sputtering process using krypton (Kr) as a sputtering gas.

Optionally, a buffer layer (not shown) may be further formed between the lower electrode layer 152 and the seed layer 156. The buffer layer may serve to match a crystal structure of the lower electrode layer 152 with a crystal structure of the seed layer 156 between the lower electrode layer 152 and the seed layer 156. In example embodiments, the buffer layer may include tantalum.

Figure 8C:
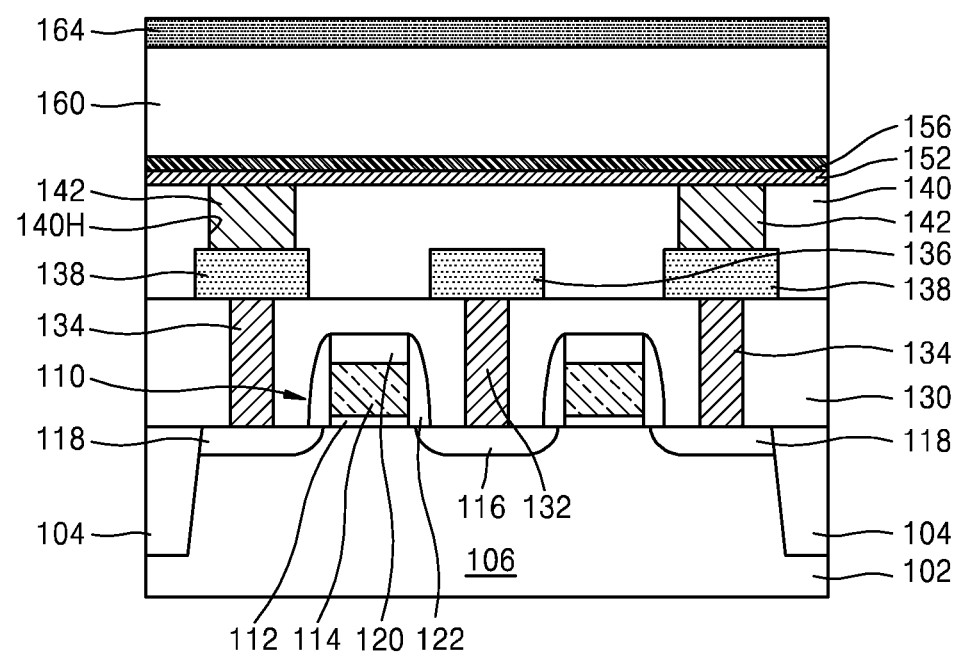

Referring to FIG. 8C, a pinned layer 160 may be formed on the seed layer 156. The pinned layer 160 may have an SAF structure similar to the pinned layer (refer to 32 in FIG. 2) described with reference to FIG. 2. A first ferromagnetic layer FM1, a non-magnetic thin layer NM, and a second ferromagnetic layer FM2 may be sequentially formed on the seed layer 156, thereby forming a pinned layer 160 in which the non-magnetic thin layer NM is interposed between the two ferromagnetic layers FM1 and FM2.

In example embodiments, the pinned layer 160 may be formed by means of an ultrathin epitaxial growth process using a solid-phase epitaxial growth process. For example, the pinned layer 160 may be formed using a molecular beam epitaxy (MBE) process or a metal organic CVD (MOCVD) process. The pinned layer 160 may be formed at a relatively low process temperature of about 200° C. to about 400° C. For example, the pinned layer 160 may be formed at a temperature of about 300° C.

In example embodiments, the ferromagnetic layers FM1 and FM2 may be formed using CoFeB, CoFe, NiFe, FePt, or CoPt. For example, the ferromagnetic layers FM1 and FM2 may have a stack structure of (Co/Pt)n (here, n is a natural number) by alternately and repetitively forming a Co layer and a Pt layer. Also, the ferromagnetic layers FM1 and FM2 may have a stack structure of (Co/Ni)n or (Co/Pd)n (here, n is a natural number). In example embodiments, the non-magnetic thin layer NM may be formed of a single metal selected from the group consisting of Cr, Pt, Pd, Ir, Rh, Ru, Os, Re, Au, and Cu or an alloy thereof.

Thereafter, a tunnel barrier 164 may be formed on the pinned layer 160. The tunnel barrier 164 may be formed of an oxide of any one material selected from the group consisting of Mg, Ti, Al, MgZn, and MgB, a titanium nitride, a vanadium nitride, or a combination thereof.

Figure 8D:
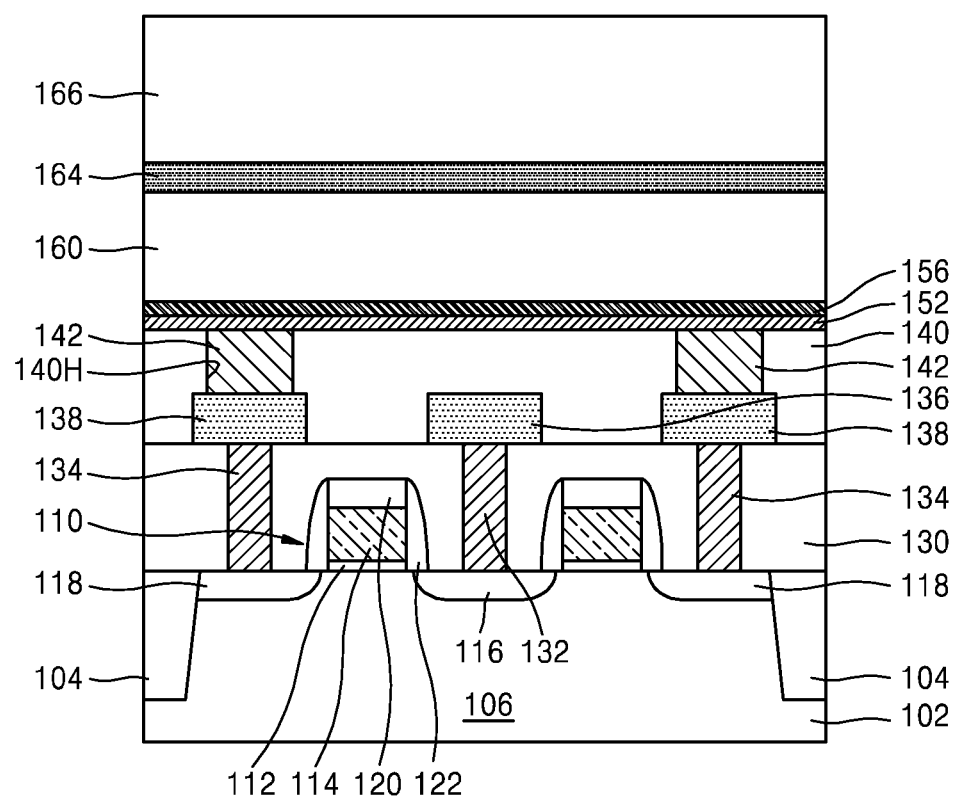

Referring to FIG. 8D, a free layer 166 may be formed on the tunnel barrier 164. In example embodiments, the free layer 166 may be formed of at least one selected from the group consisting of Fe, Co, Ni, Pd, and Pt. The free layer 166 may be formed of a Co-M1 alloy (here, M1 is at least one metal selected from the group consisting of Pt, Pd, and Ni) or a Fe-M2 alloy (here, M2 is at least one metal selected from the group consisting of Pt, Pd, and Ni). The Co-M1 alloy or the Fe-M2 alloy may have an $L1_0$ structure. In other embodiments, the free layer 166 may further include at least one selected from the group consisting of B, C, Cu, Ag, Au, Ru, Ta, and Cr. In example embodiments, the free layer 166 may have a multilayered structure of (Co/Pt)m, (Co/Pd)m, or (Co/Ni)m (here, m is a natural number).

Figure 8E:
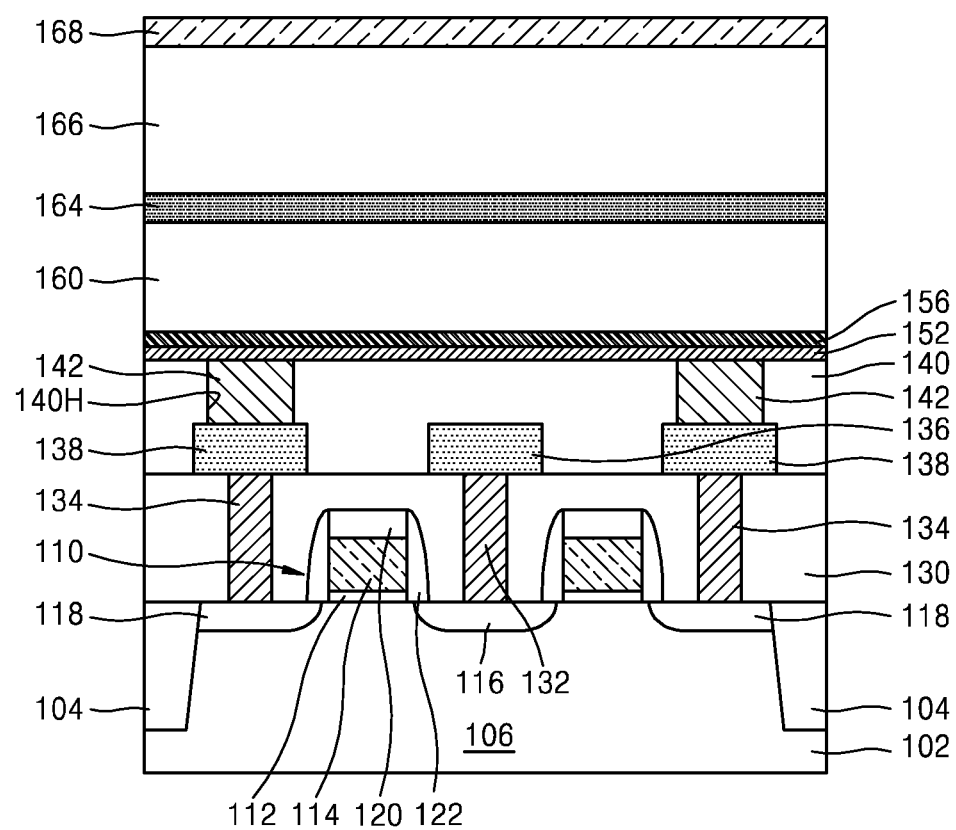

Referring to FIG. 8E, a capping layer 168 may be formed on the free layer 166. The capping layer 168 may be formed of Al, Cu, Au, Ti, or TiN to a predetermined thickness.

A stack structure formed by sequentially stacking a lower electrode layer 152 through the capping layer 168 is not limited to the example shown in FIG. 8E and may be variously changed within the scope of the inventive concept. For instance, the stack structure shown in FIG. 8E may be replaced by the same structure as a stack structure having any one of the MTJ structures 30, 40, 50, and 70 shown in FIGS. 2, 4, 5, and 7. According to example embodiments of the inventive concept, various kinds of layers may be added to the stack structure or replaced by other layers according to characteristics required by a magnetic memory device.

Figure 8F:
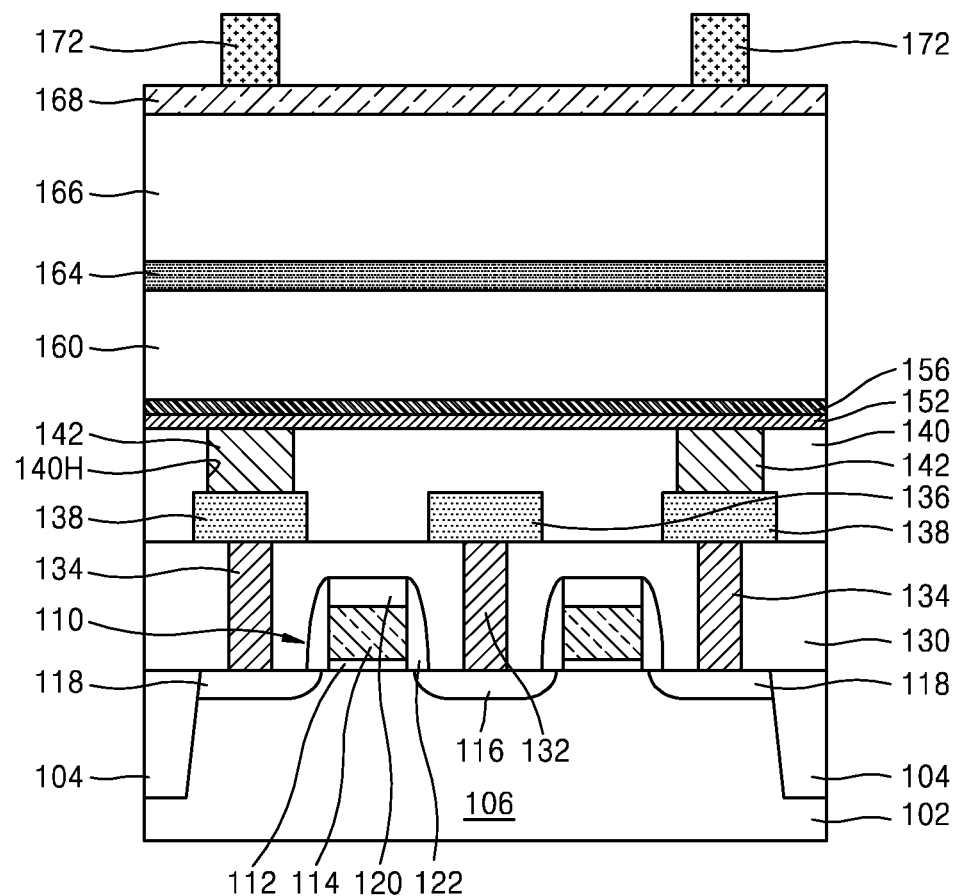

Referring to FIG. 8F, a plurality of conductive mask patterns 172 may be formed on the capping layer 168. The plurality of conductive mask patterns 172 may be formed of a metal or a metal nitride. In example embodiments, the plurality of conductive mask patterns 172 may include at least one material selected from the group consisting of Ru, W, TiN, TaN, Ti, Ta or a metallic glass alloy. For example, the conductive mask patterns 172 may have a double-layered structure formed of Ru/TiN or TiN/W. The conductive mask patterns 172 may be formed on the same axis as the lower electrode contact plug 142.

Figure 8G:
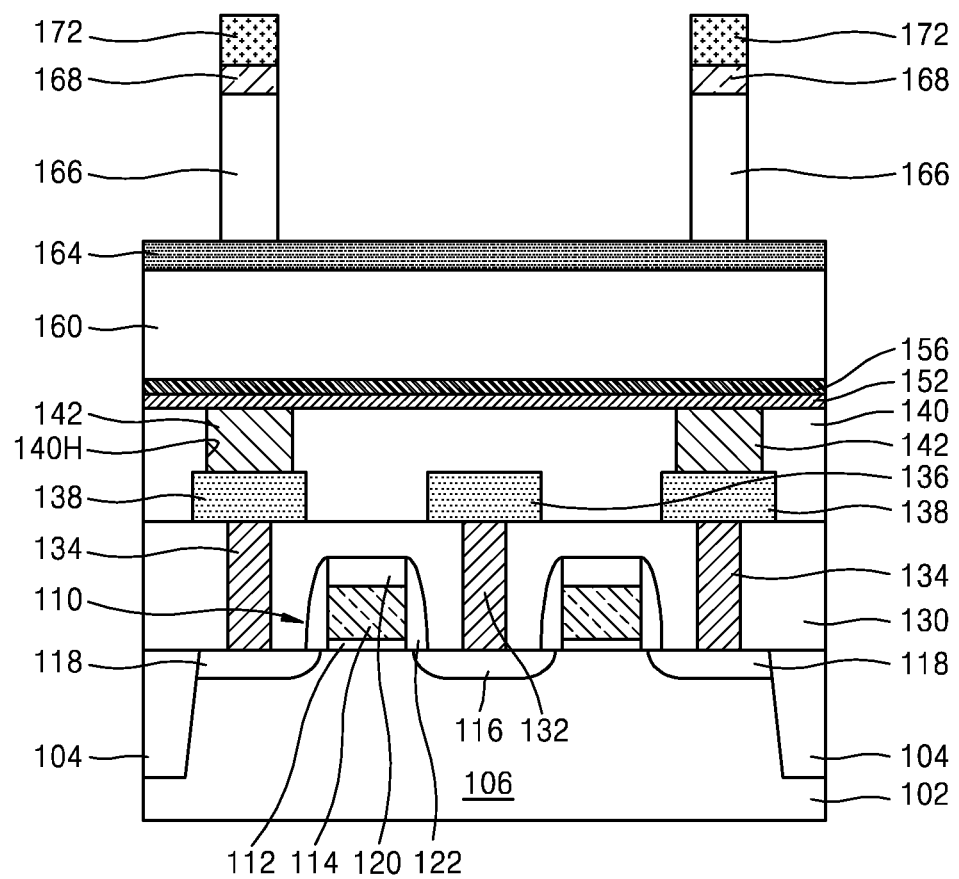

Referring to FIG. 8G, the capping layer 168 and the free layer 166 may be sequentially etched using the plurality of conductive mask patterns 172 as an etch mask until a top surface of the tunnel barrier 164 is exposed.

In example embodiments, the etching process may be a plasma etching process. In other embodiments, the etching process may be a reactive ion etching (RIE) process, an ion beam etching (IBE) process, or an argon (Ar) milling process. In example embodiments, the etching process may be performed using a first etch gas formed of $SF_6$, $NF_3$, $SiF_4$, $CF_4$, $Cl_2$, $CH_3OH$, $CH_4$, CO, $NH_3$, $H_2$, $N_2$, HBr, or a combination thereof. In other embodiments, in addition to the first etch gas, at least one first additional gas selected from the group consisting of Ne, Ar, Kr, or Xe may be further used.

The etching process may be performed using plasma generated by an inductively coupled plasma (ICP) source, a capacitively coupled plasma (CCP) source, an electron cyclotron resource (ECR) plasma source, a helicon-wave excited plasma (HWEP) source, or an adaptively coupled plasma (ACP) source.

In example embodiments, the etching process may be performed at a temperature of about −10° C. to 65° C. under a pressure of about 2 mT to about 5 mT. During the etching process, the plurality of conductive mask patterns 172 may have reduced thicknesses by etching away portions of top surfaces of the conductive mask patterns 172 in an etching atmosphere.

Figure 8H:
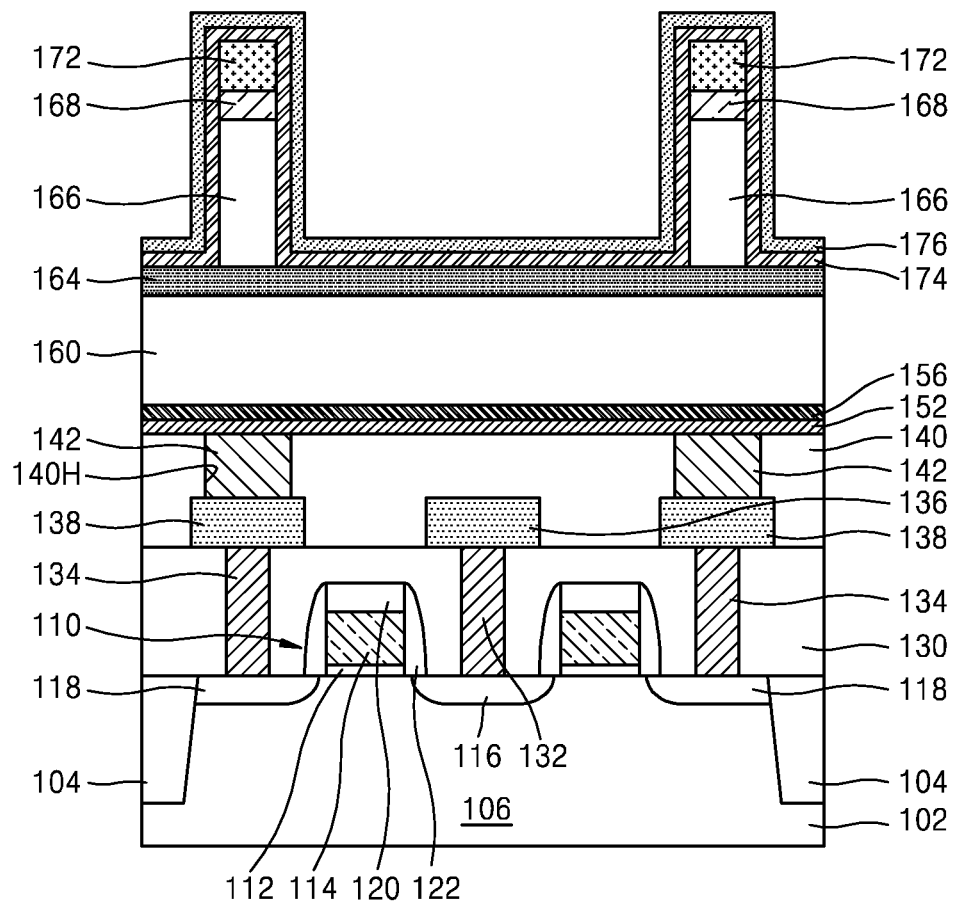

Referring to FIG. 8H, a spin current assisting layer 174 may be formed to a predetermined thickness on sidewalls of the tunnel barrier 164, the etched free layer 166, the capping layer 168, and the conductive mask patterns 172. The spin current assisting layer 174 may be formed of at least one material selected from the group consisting of tantalum (Ta), tungsten (W), platinum (Pt), gold (Au), tantalum nitride ($TaN_x$), and tungsten nitride ($WN_x$) using a CVD process, a PVD process, an ALD process, or a reactive PLD process. In example embodiments, the spin current assisting layer 174 may have one material layer formed of tantalum (Ta), tungsten (W), platinum (Pt), gold (Au), tantalum nitride ($TaN_x$), or tungsten nitride ($WN_x$) or a stack structure of at least two material layers.

Thereafter, a passivation layer 176 may be formed on the spin current assisting layer 174 to a predetermined thickness. The passivation layer 59 may be formed of an insulating material, such as silicon oxide, aluminum oxide, zinc oxide, titanium oxide, silicon oxynitride, or silicon nitride, using a CVD process, a PVD process, an ALD process, or a reactive PLD process.

Figure 8I:
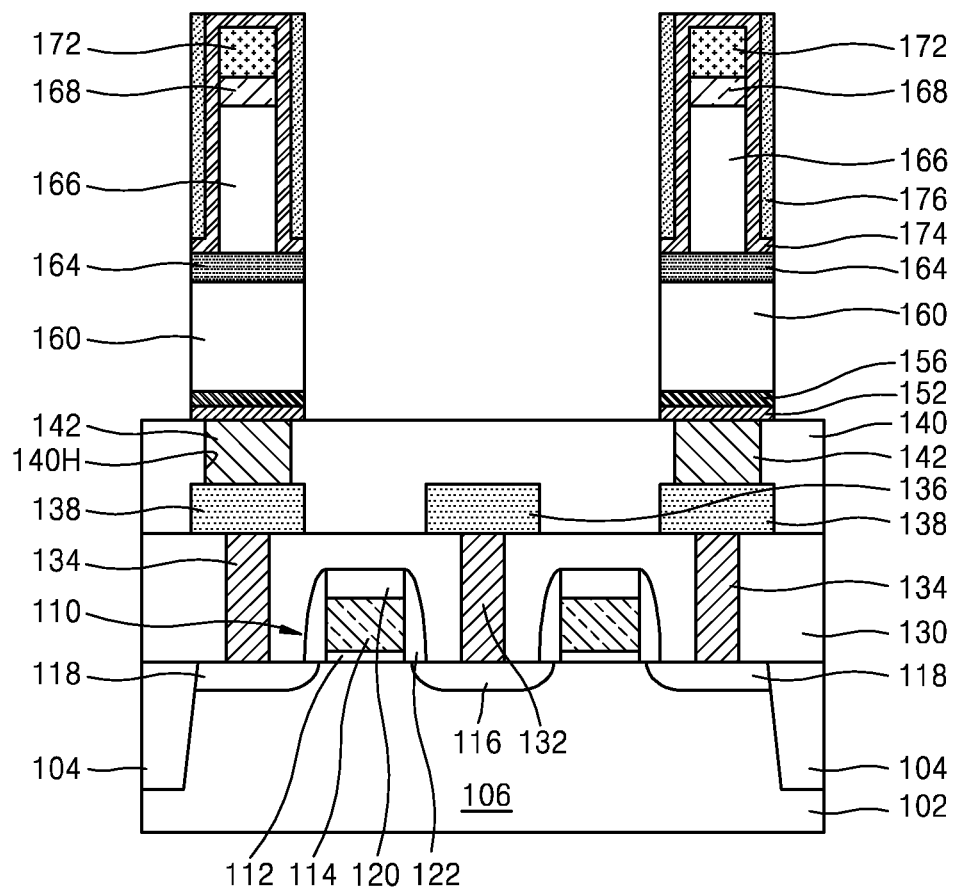

Referring to FIG. 8I, an anisotropic etching process may be performed on the passivation layer 176 so that the passivation layer 176 can remain only on sidewalls of the spin current assisting layer 174. Subsequently, the spin current assisting layer 174, the tunnel barrier 164, the pinned layer 160, the seed layer 156, and the lower electrode layer 152 may be sequentially etched using the passivation layer 176 as an etch mask (or spacers).

In example embodiments, the etching process may be a plasma etching process, an RIE process, an IBE process, or an Ar milling process. In example embodiments, the etching process may be performed using a first etch gas formed of $SF_6$, $NF_3$, $SiF_4$, $CF_4$, $Cl_2$, $CH_3OH$, $CH_4$, CO, $NH_3$, $H_2$, $N_2$, HBr, or a combination thereof. In other embodiments, in addition to the first etch gas, at least one first additional gas selected from the group consisting of Ne, Ar, Kr, or Xe may be further used. The etching process may further include an etching process using a second etch gas having a different composition from the first etch gas. The second etch gas may be formed of $SF_6$, $NF_3$, $SiF_4$, $CF_4$, $Cl_2$, $CH_3OH$, $CH_4$, CO, $NH_3$, $H_2$, $N_2$, HBr, or a combination thereof. In some other embodiments, at least one second additional gas selected from the group consisting of Ne, Ar, Kr, or Xe may be further used during the etching process using the second etch gas.

Due to the etching process, a stack structure of the lower electrode layer 152, the seed layer 156, the pinned layer 160, the tunnel barrier 164, the free layer 166, the capping layer 168, the conductive mask pattern 172, and the spin current assisting layer 174 may be formed on a plurality of lower electrode contact plugs 142. In this case, the capping layer 168, the conductive mask patterns 172, and the spin current assisting layer 174, which are formed on the free layer 166, may function as an upper electrode.

Figure 8J:
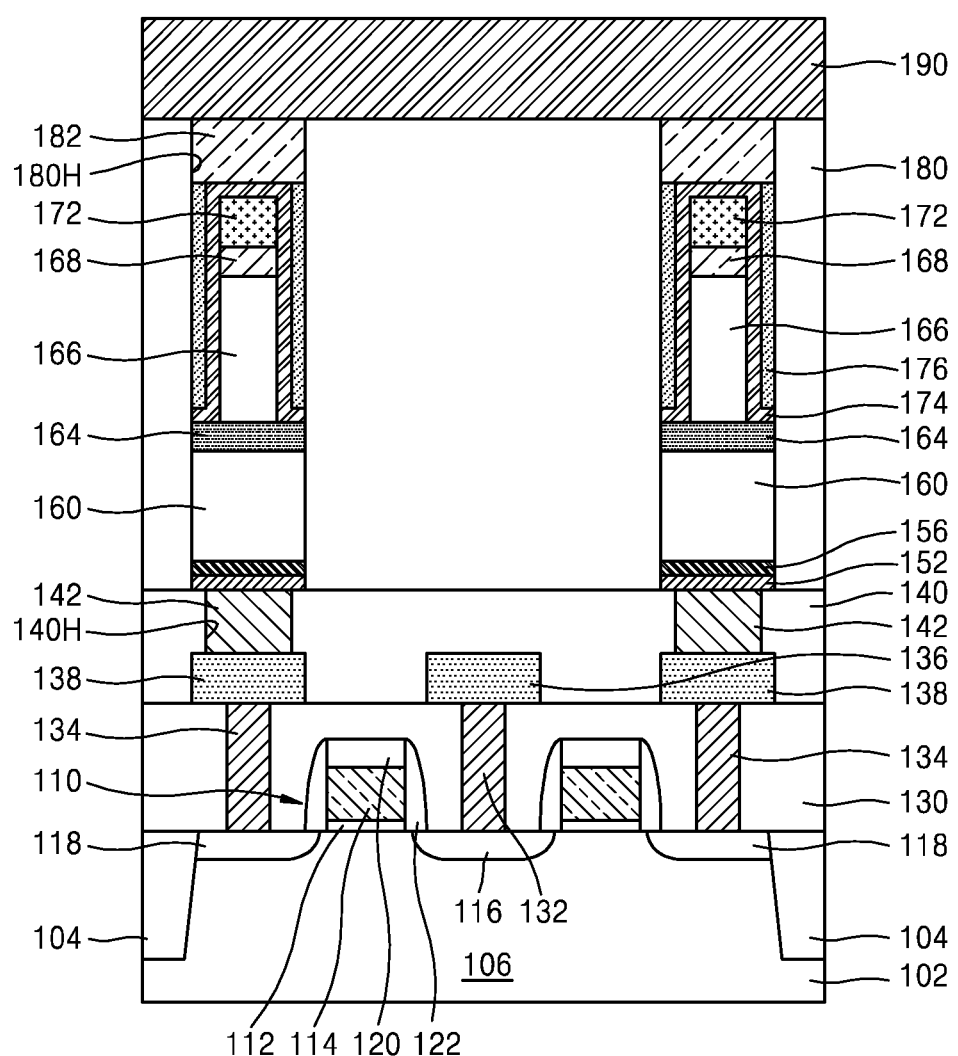

Referring to FIG. 8J, a third insulating interlayer 180 may be formed to cover the stack structure which has been formed using the etching process. Partial regions of the third insulating interlayer 180 may be removed using an etching process until a top surface of the spin current assisting layer 174 is exposed, thereby forming a plurality of bit line contact holes 180H. A conductive layer may be formed to fill the plurality of bit line contact holes 180H, and polished or etched back until a top surface of a third insulating interlayer 180 is exposed. Thus, a plurality of bit line contact plugs 182 may be formed within the plurality of bit line contact holes 180H.

Thereafter, a conductive layer for forming bit lines may be formed on the third insulating interlayer 180 and the plurality of bit line contact plugs 182, and patterned. Thus, line-shaped bit lines 190 may be formed to be electrically connected to the plurality of bit line contact plugs 182.

By performing the above-described process, the magnetic memory device 100 may be completed.

Figure 9:
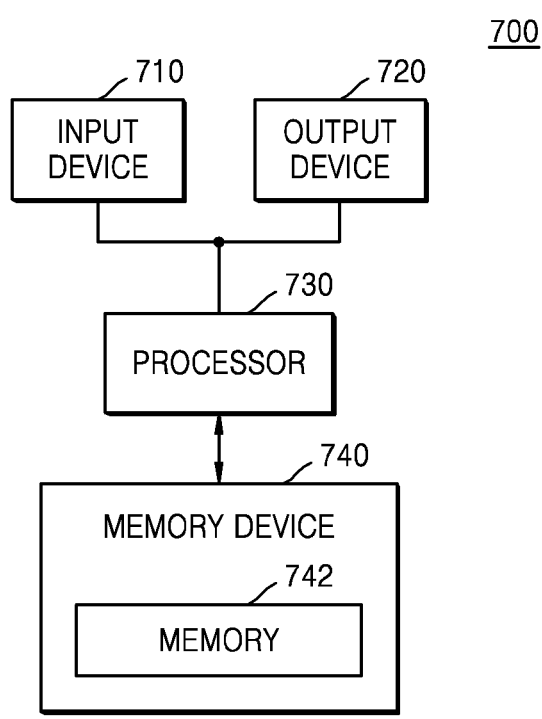
FIG. 9 is a block diagram of an information processing system including a magnetic memory device according to example embodiments of the inventive concept.

FIG. 9 is a block diagram of an electronic system 700 including a magnetic memory device according to example embodiments of the inventive concept.

Referring to FIG. 9, the electronic system 700 may include an input device 710, an output device 720, a processor 730, and a memory device 740. In some embodiments, memory device 740 may include a cell array including non-volatile memory cells and a peripheral circuit for read/write operations. In some other embodiments, the memory device 740 may include a non-volatile memory device and a memory controller.

A memory 742 included in the memory device 740 may include the MTJ structure 30, 40, 50, 60, or 70 or the magnetic memory device 10 or 100 including the MTJ structure 30, 40, 50, 60, or 70 according to the example embodiments described with reference to FIGS. 1 through 8J.

The processor 730 may be connected to each of the input device 710, the output device 720, and the memory device 740 through an interface and control general operations.

Figure 10:
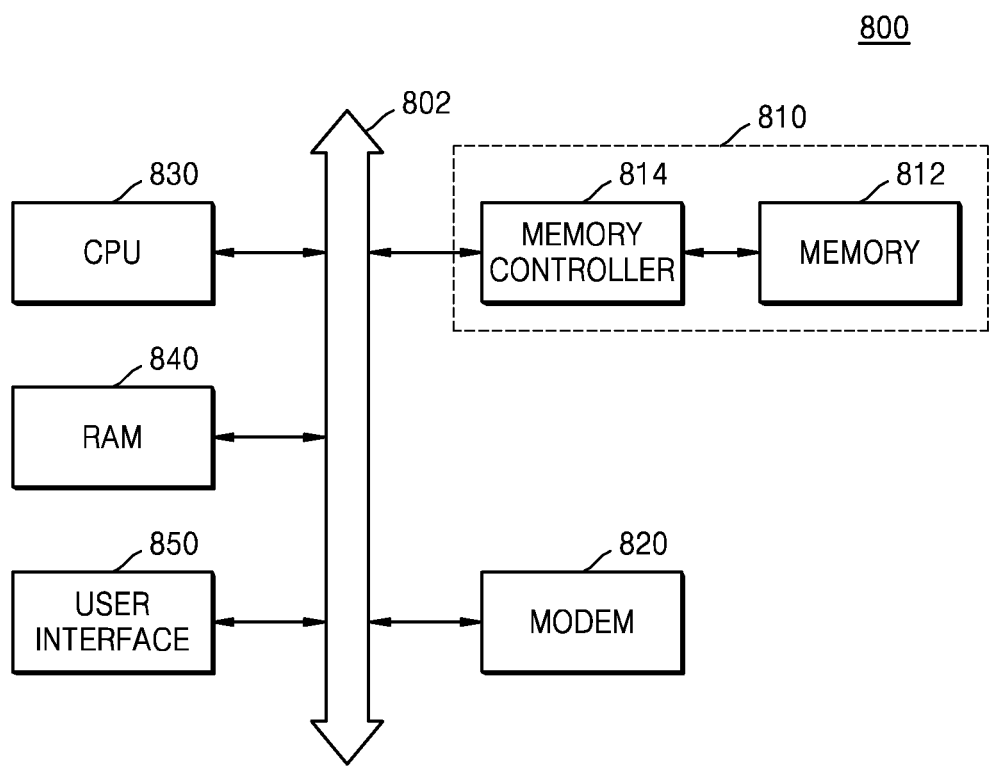
FIG. 10 is a block diagram of an electronic system including a magnetic memory device according to example embodiments of the inventive concept.

FIG. 10 is a block diagram of an information processing system 800 including a magnetic memory device according to example embodiments of the inventive concept.

Referring to FIG. 10, the information processing system 800 may include a non-volatile memory system 810, a modem 820, a central processing unit (CPU) 830, an RAM 840, and a user interface 850, which may be electrically connected to a bus 802.

The non-volatile memory system 810 may include a memory 812 and a memory controller 814. Data processed by the CPU 830 or externally input data may be stored in the non-volatile memory system 810.

The non-volatile memory system 810 may include a non-volatile memory device, such as an MRAM, a phase-change RAM (PRAM), a resistive RAM (RRAM), or a ferroelectric RAM (FRAM). At least one of the memory 812 and the RAM 840 may include the MTJ structure 30, 40, 50, 60, or 70 or the magnetic memory device 10 or 100 including the MTJ structure 30, 40, 50, 60, or 70 according to the example embodiments described with reference to FIGS. 1 through 8J.

The information processing system 800 may be used for a portable computer, a web tablet, a wireless phone, a mobile phone, a digital music player, a memory card), an MPEG-1 audio layer 3 (MP3) player, a navigation, a portable multimedia player (PMP), a solid state disk (SSD), or household appliances.

Figure 11:
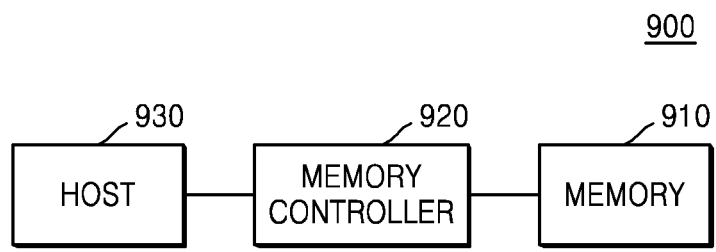
FIG. 11 is a block diagram of a memory card including a magnetic memory device according to example embodiments of the inventive concept.

FIG. 11 is a block diagram of a memory card 900 including a magnetic memory device according to example embodiments of the inventive concept.

The memory card 900 may include a memory 910 and a memory controller 920.

The memory 910 may store data. In some embodiments, the memory 910 may have non-volatile characteristics so that even if power supply is interrupted, the memory 910 may still retain stored data. The memory 910 may include the MTJ structure 30, 40, 50, 60, or 70 or the magnetic memory device 10 or 100 including the MTJ structure 30, 40, 50, 60, or 70 according to the example embodiments described with reference to FIGS. 1 through 8J.

The memory controller 920 may read data stored in the memory 910 or store data in the memory 910 in response to read/write commands from a host 930.

While the inventive concept has been particularly shown and described with reference to example embodiments thereof, it will be understood that various changes in form and details may be made therein without departing from the spirit and scope of the following claims.

What is claimed is:

1. A magnetic memory device comprising:
   a first magnetization layer;
   a tunnel barrier disposed on the first magnetization layer;
   a second magnetization layer on the tunnel barrier; and
   a spin current assisting layer on at least a portion of a top surface of the second magnetization layer and on at least a portion of a sidewall of the second magnetization layer.

2. The device of claim 1, wherein the spin current assisting layer surrounds the sidewall of the second magnetization layer.

3. The device of claim 1, wherein the spin current assisting layer is in contact with a portion of the tunnel barrier.

4. The device of claim 1, further comprising a passivation layer configured to surround a sidewall of the spin current assisting layer.

5. The device of claim 1, wherein the spin current assisting layer includes a material having a giant spin Hall effect.

6. The device of claim 1, wherein the spin current assisting layer has a spin Hall angle of about 0.05 to about 0.5.

7. The device of claim 1, wherein the spin current assisting layer includes at least one element selected from the group consisting of tantalum (Ta), tungsten (W), platinum (Pt), tantalum nitride ($TaN_x$), and tungsten nitride ($WN_x$).

8. The device of claim 1, wherein the spin current assisting layer includes a first material layer formed on the sidewall of the second magnetization layer, and a second material layer disposed on the first material layer.

9. A magnetic memory device comprising:
   a pinned layer including a first magnetization layer;
   a free layer including a second magnetization layer;
   a tunnel barrier interposed between the pinned layer and the free layer; and
   a spin current assisting layer on at least a portion of a top surface of the free layer and on at least a portion of a sidewall of the free layer, wherein the spin current assisting layer is in contact with at least a portion of the tunnel barrier.

10. The device of claim 9, wherein the magnetization easy axis extends along the sidewall of the free layer in a direction from the pinned layer toward the free layer.

11. The device of claim 9, wherein the spin current assisting layer is not electrically connected to the pinned layer.

12. The device of claim 9, wherein the free layer has a first width in a direction parallel to a top surface of the tunnel barrier, and
   the first width of the free layer ranges from about 5 nm to about 50 nm.

13. The device of claim 12, wherein the free layer has a first height in a direction perpendicular to the top surface of the tunnel barrier, and
   the first height of the free layer ranges from about 2 nm to about 50 nm.

14. The device of claim 13, wherein when an aspect ratio of the free layer is defined by a ratio of the first height to the first width, the aspect ratio of the free layer ranges from about 0.1 to about 25.

15. A magnetic memory device comprising:
   a magnetic tunnel junction (MTJ) structure including a first magnetization layer, a second magnetization layer, and a tunnel barrier interposed between the first and second magnetization layers; and
   a spin current assisting layer on at least a portion of a top surface of the MTJ structure and on a portion of a sidewall of the MTJ structure.

16. The device of claim 15, wherein the spin current assisting layer is formed on a sidewall of the first magnetization layer.

17. The device of claim 15, wherein the spin current assisting layer is electrically connected to the first magnetization layer.

18. The device of claim 15, further comprising a passivation layer on the spin current assisting layer.

19. The device of claim 15, wherein the spin current assisting layer includes a first material layer and a second material layer sequentially stacked on a sidewall of the first magnetization layer.

* * * * *